(12) United States Patent
Park

(10) Patent No.: US 7,883,984 B2
(45) Date of Patent: Feb. 8, 2011

(54) METHOD OF MANUFACTURING FLASH MEMORY DEVICE

(75) Inventor: Ji-Hwan Park, Yeonsu-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/620,811

(22) Filed: Nov. 18, 2009

(65) Prior Publication Data

US 2010/0129973 A1    May 27, 2010

(30) Foreign Application Priority Data

Nov. 24, 2008    (KR) ...................... 10-2008-0116628

(51) Int. Cl.
  *H01L 21/20* (2006.01)
  *H01L 21/8242* (2006.01)
  *H01L 21/336* (2006.01)
(52) U.S. Cl. ...................... 438/389; 438/246; 438/247; 438/252; 438/257; 438/270; 257/E21.409; 257/E21.62; 257/E21.682
(58) Field of Classification Search .......... 257/E21.409, 257/E21.62, E21.682
See application file for complete search history.

(56) References Cited

U.S. PATENT DOCUMENTS

| 4,413,401 | A | * | 11/1983 | Klein et al. | ................. | 438/395 |
| 2007/0152255 | A1 | * | 7/2007 | Seo et al. | .................... | 257/302 |
| 2008/0017910 | A1 | * | 1/2008 | Shin | ......................... | 257/314 |

FOREIGN PATENT DOCUMENTS

KR    10-2006-0072751    6/2006

* cited by examiner

*Primary Examiner*—Alexander G Ghyka
*Assistant Examiner*—Mohsen Ahmadi
(74) *Attorney, Agent, or Firm*—Sherr & Vaughn, PLLC

(57) ABSTRACT

A method of manufacturing a flash memory device may include forming a trench, defining at least a common source region, on a semiconductor substrate, forming a gate poly over the semiconductor substrate, performing an ion implantation process employing a first photoresist pattern and the gate poly as a mask, wherein the ion implantation process forms a source/drain junction on the semiconductor substrate, forming a recess common source region in the trench by using a second photoresist pattern, and performing an ion implantation process on the recess common source region.

6 Claims, 8 Drawing Sheets

METHOD OF MANUFACTURING FLASH MEMORY DEVICE

Figure 1:
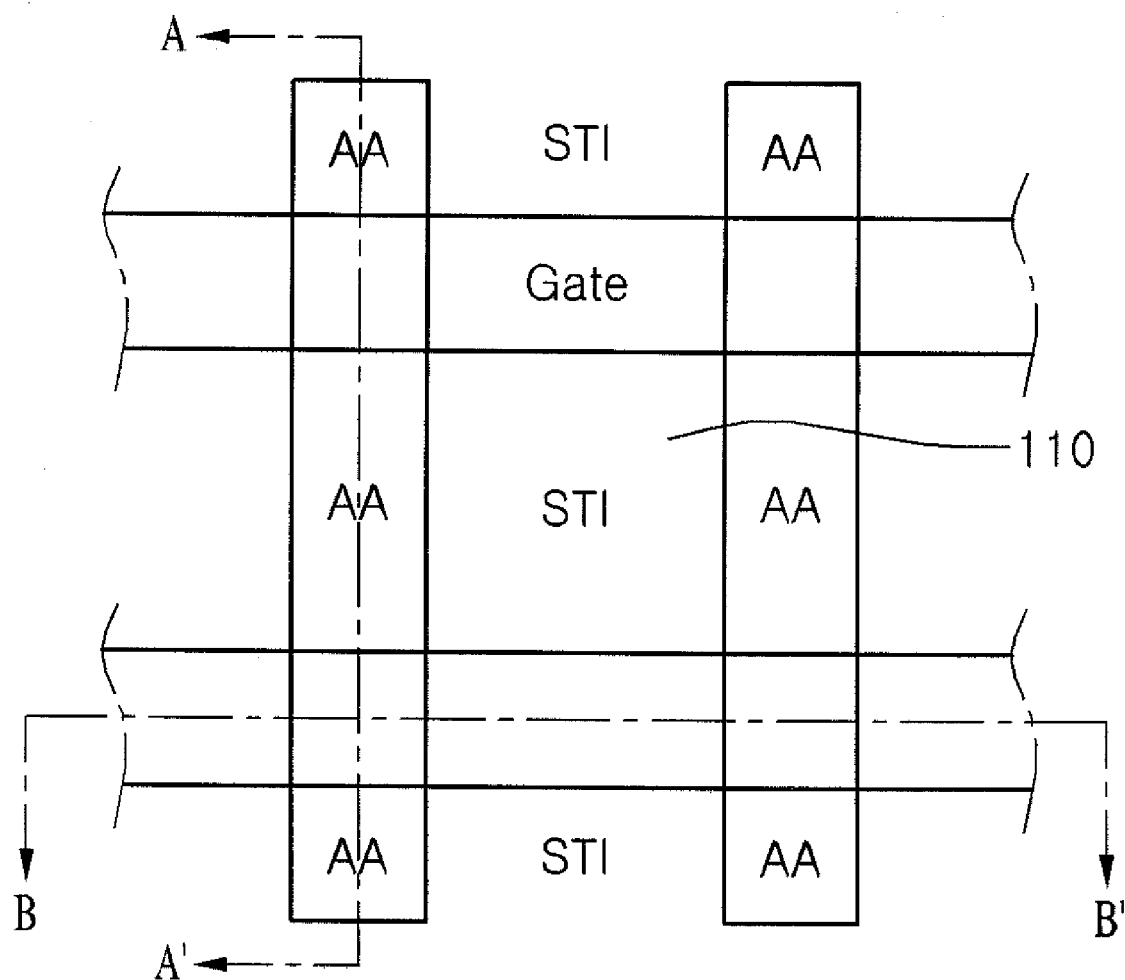

The present application claims priority under 35 U.S.C. 119 to Korean Patent Application No. 10-2008-0116628 (filed on Nov. 24, 2008), which is hereby incorporated by reference in its entirety.

BACKGROUND

A flash memory is a kind of a programmable ROM (PROM) in which data can be electrically erased or programmed. Flash memory combines advantages of an erasable PROM (EPROM) and an electrically erasable PROM (EEPROM). An EPROM includes a memory cell with one transistor to provide a small cell area, but it must be erased by ultraviolet rays. An EEPROM includes a memory cell with two transistors which is electrically erasable, but it requires a large cell area. A flash memory includes one transistor like the EPROM, while retaining the electrical erasing capability of the EEPROM. Flash memory is perhaps more correctly referred to as a flash EEPROM.

According to the structure of a cell array, flash memory may be classified as having a NOR-type structure, in which cells are arranged in parallel between a bit line and the ground, or as having a NAND-type structure, in which the cells are arranged in series between the bit line and the ground. Since the NOR-type flash memory, with a parallel structure, supports high-speed random access in reading, the NOR-type flash memory may be used for booting portable phones. Since the NAND-type flash memory, having a series structure, has a fast writing speed and a low reading speed, the NAND-type flash memory is suitable for data storage and applications where compactness is especially important.

Flash memory may also be classified into stack gate types and split gate types according to the structure of a unit cell. Further, flash memory devices can be classified as floating gate devices and silicon-oxide-nitride-oxide-silicon (SONOS) devices according to the type of charge storage layer employed. Floating gate devices include a floating gate of polycrystalline silicon surrounded by an insulator. Charges are injected into or emitted from the floating gate by channel hot carrier injection or Fowler-Nordheim tunneling (F-N tunneling), to store or erase data.

According to a related method of manufacturing flash memory devices, to form a cell junction, an ion implantation process for a recess common source (RCS) region connecting sources of several cells, and a cell source/drain (CSD) ion implantation process of forming a source/drain junction before forming spacers of a gate are performed. In other words, an ion implantation process of forming the junction between cells includes the ion implantation process for the RCS region after the RCS region has been formed and the CSD ion implantation process performed after the ion implantation process for the RCS region. Therefore, to perform the CSD ion implantation process after the RCS region has been formed and then the ion implantation process has been performed with respect to the RCS region, pattering, ion implantation, ashing, and cleaning must be repeated twice.

SUMMARY

Embodiments relate to a method of manufacturing a flash memory device capable of reducing the manufacturing time and the manufacturing cost by reducing the number of process steps for an ion implantation process of forming the junction between cells in the flash memory device.

According to embodiments, a method of manufacturing a flash memory device may include forming a trench, defining at least a common source region, on a semiconductor substrate, forming a gate poly over the semiconductor substrate, performing an ion implantation process employing a first photoresist pattern and the gate poly as a mask, wherein the ion implantation process forms a source/drain junction on the semiconductor substrate, forming a recess common source region in the trench by using a second photoresist pattern, and performing an ion implantation process on the recess common source region.

According to embodiments, a method of manufacturing a flash memory device may include forming a gate poly over a semiconductor substrate including a first region and a second region, forming a first photoresist pattern over the semiconductor substrate of the second region, performing an ion implantation process to form a source/drain junction in the first region using the gate poly of the first region and the first photoresist pattern as an ion implantation mask, exposing a trench of the semiconductor substrate by forming a second photoresist pattern over the semiconductor substrate of the first region, forming a recess common source region by removing an oxide layer from the trench, and performing an ion implantation process on the recess common source region.

DRAWINGS

Example FIG. 1 is a plan view showing a flash memory device.

Example FIGS. 2 to 8 are views showing a method of manufacturing a flash memory device according to embodiments.

DESCRIPTION

Example FIG. 1 is a plan view showing a flash memory, and example FIGS. 2 to 8 are views showing a method of manufacturing the flash memory device according to embodiments. Referring to example FIG. 1, an isolation layer may be formed on a semiconductor substrate to define an active region AA. A poly silicon layer may be formed over the semiconductor substrate to form a gate poly.

In the following description about the method of manufacturing the flash memory according to embodiments, a scheme to reduce the number of process steps when performing a cell source/drain (CSD) ion implantation process for forming a source/drain junction, a recess common source (RCS) region forming process, and an ion implantation process for a RCS region will be given with reference to sectional views taken along lines A-A' (first region) and B-B' (second region) of example FIG. 1.

Figure 2:
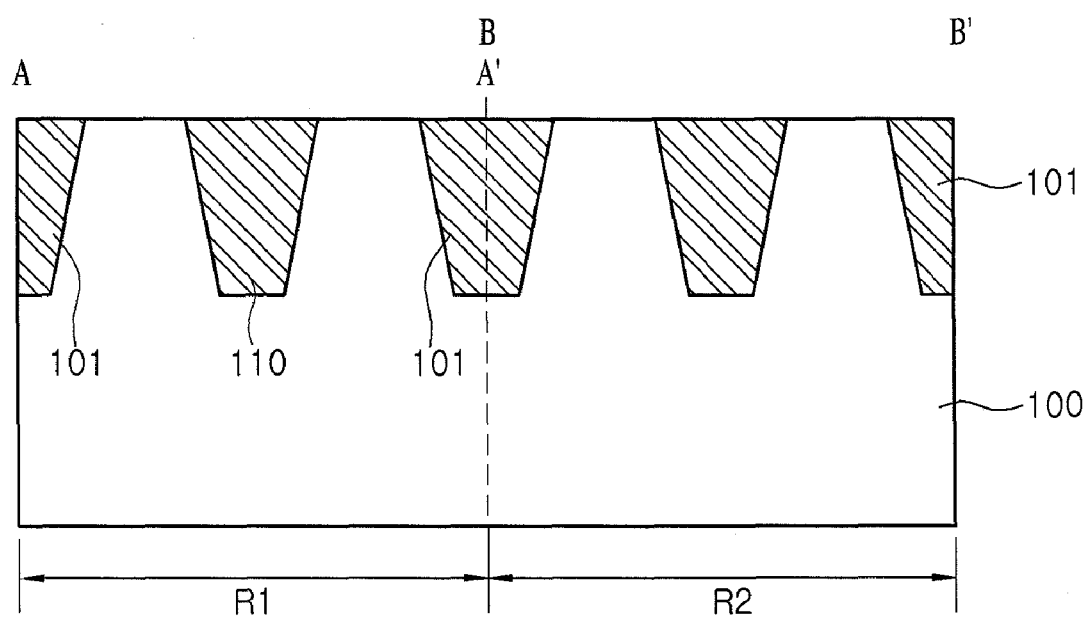

Referring to example FIG. 2, an isolation layer 101 may be formed in a semiconductor substrate 100 to define an active region. As shown in example FIG. 2, a plurality of isolation layers 101 and trenches 110 may be formed in the semiconductor substrate 100 through an STI process. The trench 110 may be filled with an oxide layer to serve as an isolation layer. However, since the trench 110 may be exposed as a common source region in the subsequent processes, the isolation layer 101 will be distinguished from the trench 110 in the following description.

For the purposes of the detailed description about embodiments, regions taken along line A-A' and line B-B' of example FIG. 1 are named as a first region R1 and a second region R2, respectively, in example FIG. 2. The isolation layer assigned with reference number 101 is not shown in the section taken along line A-A' of example FIG. 1. However, the isolation layers 101 are shown in example FIG. 2 with the trench 110 for the RCS region between the isolation layers 101 for the purpose of explaining the RCS region forming process and the ion implantation process for the RCS region according to embodiments.

Figure 3:
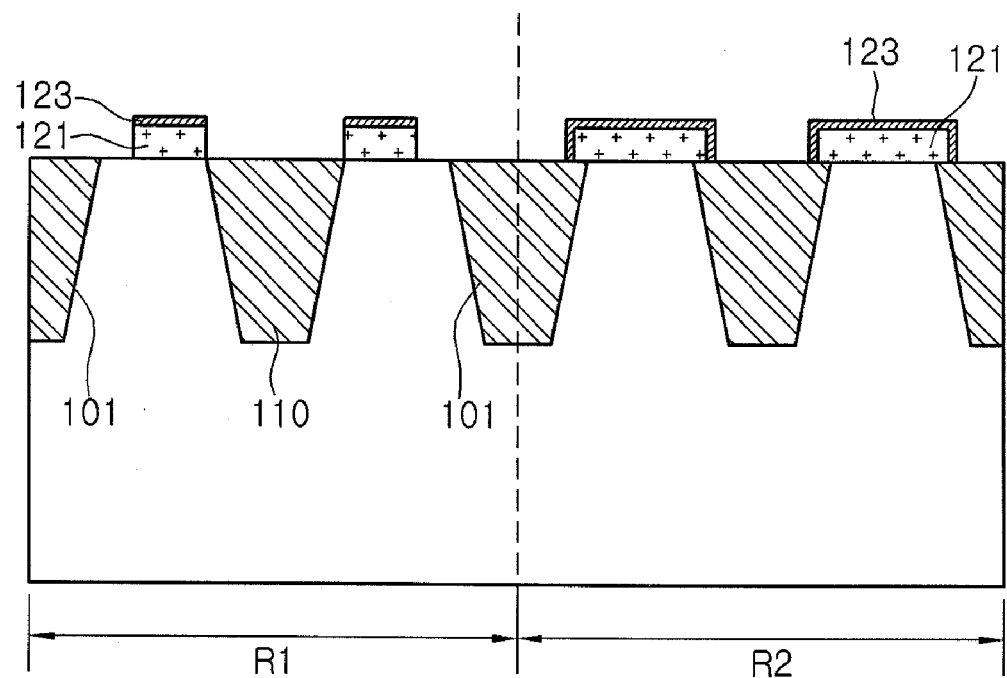

Thereafter, referring to example FIG. 3, after forming and patterning a first poly silicon layer over the semiconductor substrate, a floating gate 121 may be formed in the cell region. A tunnel oxide layer may be formed below the floating gate 121 by patterning an oxide layer.

After sequentially stacking an oxide layer, a nitride layer, and an oxide layer over the semiconductor substrate 100 including the floating gate 121, the resultant structure may be subjected to annealing and patterning to form an ONO layer 123 surrounding the floating gate 121. The ONO layer 123 insulates a floating gate from a control gate.

The floating gate 121 may be doped with doping materials in a state in which the floating gate 121 is interposed between the tunnel oxide layer and the ONO layer 123. Accordingly, the floating gate 121 retains charges (electrons) in an exited state.

Figure 4:
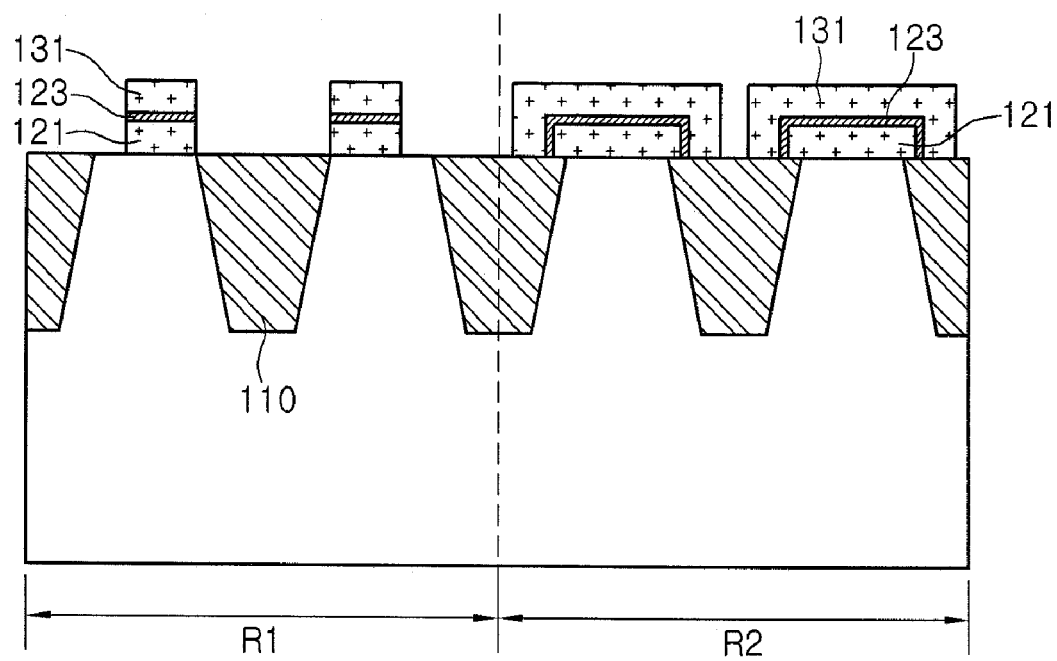

Next, referring to example FIG. 4, after depositing a second poly silicon layer over the ONO layer 123, the second poly silicon layer may be patterned to form a control gate 131 covering the ONO layer 123. The control gate 131 applies a bias voltage used for charging or discharging by exciting electrons retained in the floating gate 121. The tunnel oxide layer, the floating gate 121, the ONO layer 123, and the control gate 131 form one gate poly, and a plurality of gate polys may be aligned on a predetermined interval in a bit line direction of a memory device.

Figure 5:
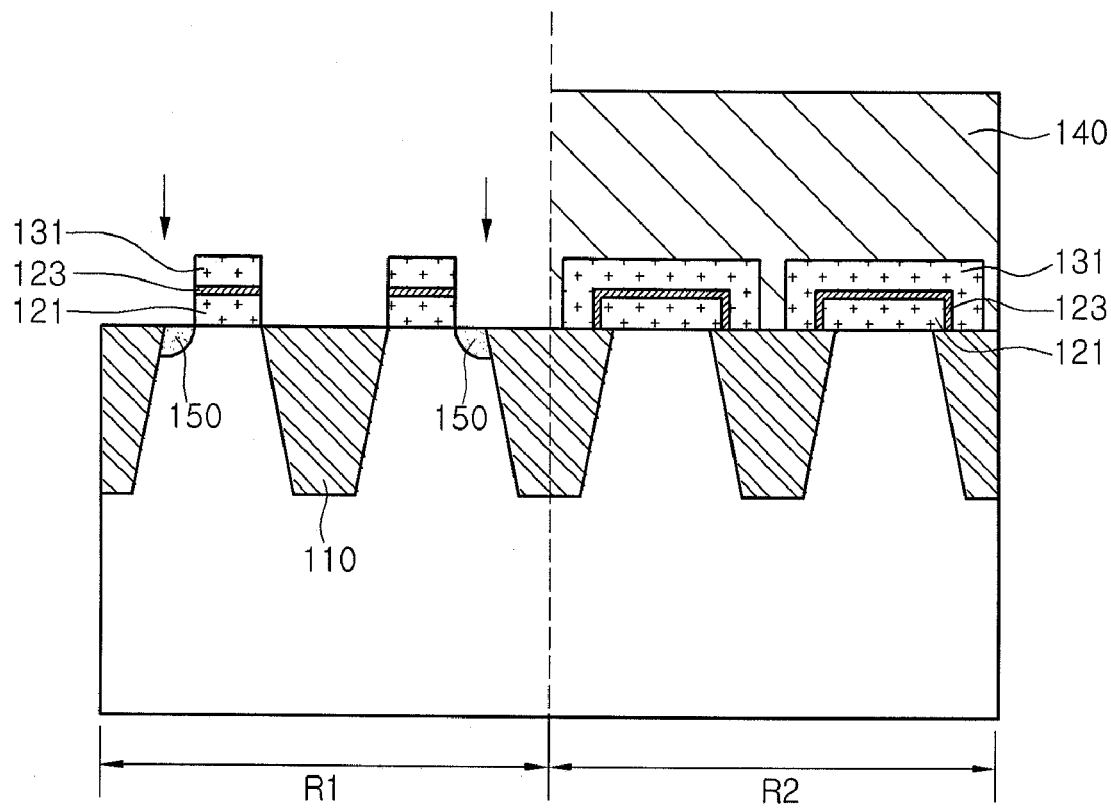

Hereinafter, description about the CSD ion implantation process to form a source/drain junction for the first region R1 of the semiconductor substrate 100 will be described with reference to example FIG. 5. In other words, after forming a photoresist pattern 140 to cover the second region, an ion implantation process may be performed, with respect to the semiconductor substrate 100 corresponding to the first region, by employing the control gate 131 as a mask, thereby forming a source/drain region 150 in the semiconductor substrate 100.

The trench 110 in the first region of the semiconductor substrate 100 is shown only for the purpose of explanation. Accordingly, the source/drain region is formed in the active region between gate polys of the first region.

Figure 6:
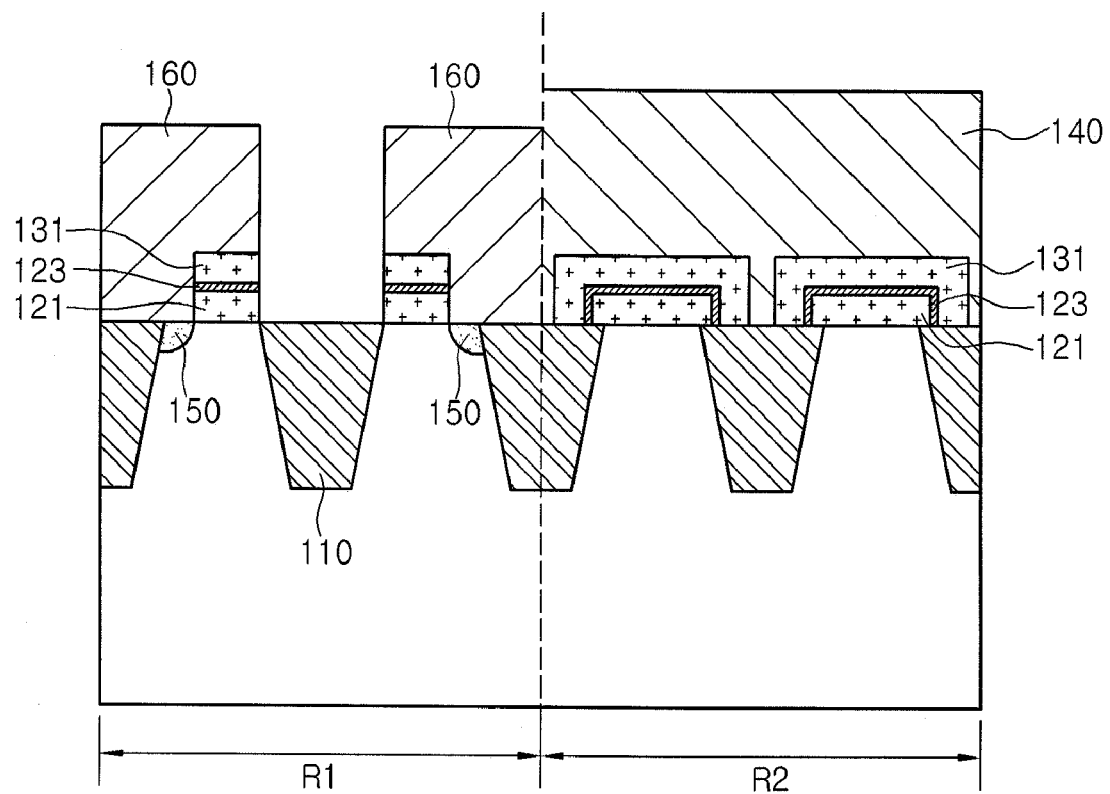

Thereafter, referring to example FIG. 6, the RCS region forming process may be performed with respect to the semiconductor substrate 100 after the source/drain junction has been formed. In order to explain a source/drain junction forming process and the RCS region forming process according to embodiments, the trench 110 is shown in the first region.

To form an RCS region, a second photoresist pattern 160 may be formed, over the semiconductor substrate 100 corresponding to the first region having gate polys, to expose the trench 110 that is a common source region. The second photoresist pattern 160 may be formed over the semiconductor substrate 100 of the first region in a state in which the first photoresist pattern 140 has been formed over the semiconductor substrate 100 of the second region.

In particular, the trench 110 may be exposed by the second photoresist pattern 160. In other words, the second photoresist pattern 160, with an opening to expose the trench 110, may be formed at one side of the first photoresist pattern 140, after the first photoresist pattern 140 has been formed.

Next, an oxide layer of the trench 110 may be removed by using the gate poly including the control gate 131 and the second photoresist pattern 160 as an etch mask. If the oxide layer has been removed from the trench 110, the trench 110 is exposed as a common source region having a recess shape as shown in example FIG. 6.

Figure 7:
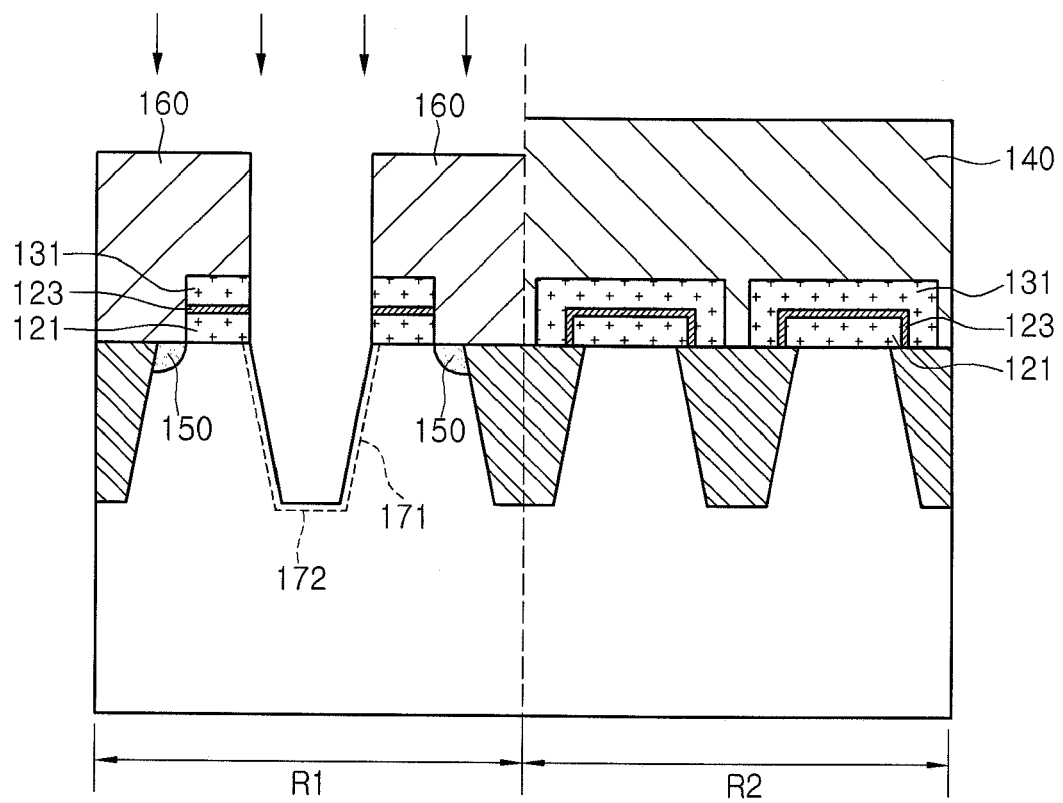

Thereafter, referring to example FIG. 7, an ion implantation process is performed with respect to the semiconductor substrate 100 including the trench 110 in a state in which the first and second photoresist patterns 140 and 160 are formed, thereby forming an impurity diffusion layer to form RCS regions 171 and 172 that are common source regions.

As shown in example FIG. 7, impurities are implanted into the trench 110 in order to form the impurity diffusion layer in the trench 110, thereby forming the RCS regions 171 and 172. As the RCS regions 171 and 172 are formed as the common source region, the impurity diffusion layer electrically connects source diffusion regions of cells with each other.

Although not shown, annealing treatment may be performed in order to stabilize dopants of the RCS regions 171 and 172 serving as a common source region. If an RTP scheme is employed, the annealing treatment for stabilizing the dopants may be performed at nitrogen ($N_2$) atmosphere under a temperature of 800° C. to 1050° C.

Figure 8:
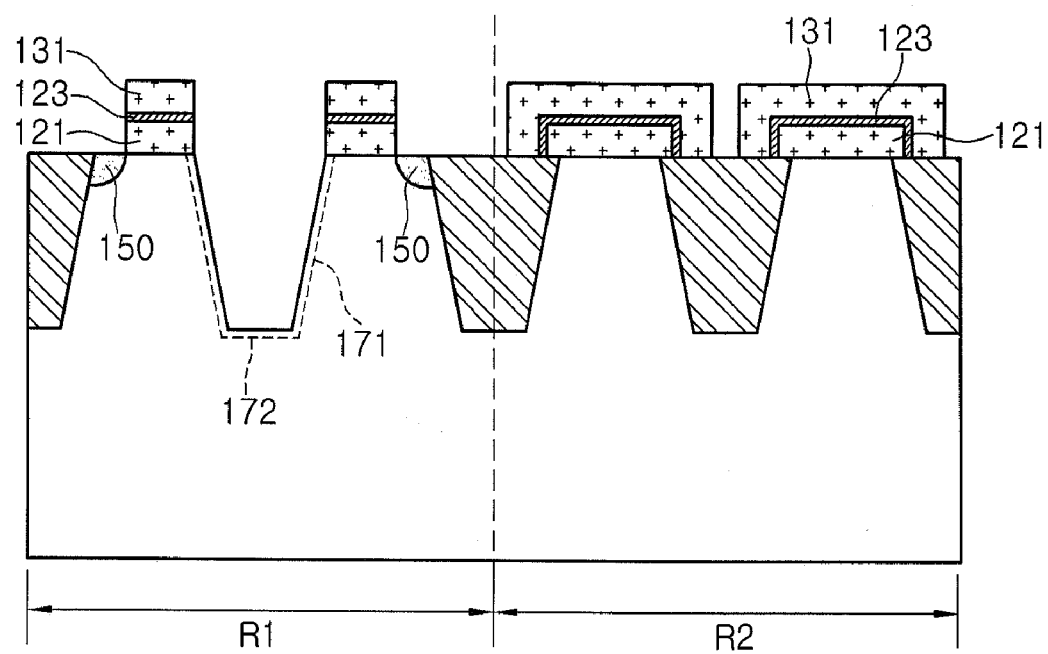

Thereafter, referring to example FIG. 8, after the RCS regions 171 and 172 serving as the common source region have been formed, an ashing process may be performed to remove the first photoresist pattern 140 and the second photoresist pattern 160 formed the second region and the first region over the semiconductor substrate 100, respectively.

For example, the ashing process may be performed to remove the first and second photoresist patterns 140 and 160 by applying hydrogen ($H_2$) gas having a plasma sate at a flow rate of 8000 sccm with a temperature of 250° C. In addition, a cleaning process may be performed while removing the first and second photoresist patterns 140 and 160 through the ashing process.

Thereafter, the generally-known manufacturing process of a flash memory device may be performed with respect to the semiconductor substrate 100 from which the first and second photoresist patterns 140 and 160 have been removed, thereby manufacturing a flash memory device.

According to embodiments, after the CSD ion implantation process for a source/drain junction has been performed, the RCS region is formed in a semiconductor substrate and an ion implantation process for the RCS region is performed. Accordingly, the number of process steps of patterning and removing photoresist can be reduced.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
    forming a trench, defining at least a common source region, on a semiconductor substrate;
    forming a gate poly over the semiconductor substrate;
    performing an ion implantation process employing a first photoresist pattern and the gate poly as a mask, wherein the ion implantation process forms a source/drain junction on the semiconductor substrate;
    forming a recess common source region in the trench by using a second photoresist pattern, wherein the second photoresist pattern is formed over areas adjacent to the first photoresist pattern and exposes the trench while the first photoresist pattern remains over the semiconductor substrate; and performing an ion implantation process on the recess common source region.

2. The method of claim 1, wherein the recess common source region is subject to an annealing process after the ion implantation process has been performed.

3. The method of claim 2, wherein the annealing process is carried out in a nitrogen atmosphere.

4. The method of claim 3, wherein the annealing process is carried out at a temperature between 800° C. to 1050° C.

5. The method of claim 1 including, after performing an ion implantation process with respect to the recess common source region, performing an ashing process to remove the first photoresist pattern and the second photoresist pattern.

6. The method of claim 1 including, after performing an ion implantation process with respect to the recess common source region, forming a flash memory device over the substrate.

* * * * *